(12) United States Patent
Kato et al.

(10) Patent No.: US 10,650,894 B2
(45) Date of Patent: May 12, 2020

(54) SEMICONDUCTOR MEMORY DEVICE AND CONTROL METHOD THEREOF

(71) Applicant: Toshiba Memory Corporation, Minato-ku, Tokyo (JP)

(72) Inventors: Tatsuya Kato, Yokkaichi Mie (JP); Yusuke Shimada, Yokkaichi Mie (JP); Fumitaka Arai, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/296,100

(22) Filed: Mar. 7, 2019

(65) Prior Publication Data

US 2020/0090752 A1    Mar. 19, 2020

(30) Foreign Application Priority Data

Sep. 19, 2018  (JP) .................................. 2018-175464

(51) Int. Cl.
*G11C 16/26*    (2006.01)
*G11C 16/04*    (2006.01)
(Continued)

(52) U.S. Cl.
CPC .......... *G11C 16/0466* (2013.01); *G11C 16/26* (2013.01); *H01L 27/1157* (2013.01); *H01L 27/11582* (2013.01)

(58) Field of Classification Search
CPC ........................... G11C 16/10; G11C 16/0483
(Continued)

(56) References Cited

U.S. PATENT DOCUMENTS

| 6,175,522 B1 * | 1/2001 | Fang ................. G11C 16/0483 |
|---|---|---|
| | | 365/185.17 |
| 6,519,191 B1 * | 2/2003 | Morishita ................ G11C 5/14 |
| | | 365/189.09 |

(Continued)

FOREIGN PATENT DOCUMENTS

| JP | 2010-134983 A | 6/2010 |
|---|---|---|
| JP | 4913191 A | 4/2012 |

(Continued)

*Primary Examiner* — Michael T Tran
(74) *Attorney, Agent, or Firm* — Foley & Lardner LLP

(57) ABSTRACT

A semiconductor memory device of an embodiment includes a substrate, a first conductive layer provided above the substrate, the first conductive layer being spaced apart from the substrate in a first direction, and the first conductive layer being provided parallel to a substrate plane, a second conductive layer provided adjacent to the first conductive layer in a second direction intersecting the first direction, the second conductive layer being provided parallel to the substrate plane, a third conductive layer provided above the first conductive layer, the third conductive layer being spaced apart from the first conductive layer in the first direction, and the third conductive layer being provided parallel to the substrate plane, a fourth conductive layer provided above the second conductive layer, the fourth conductive layer being spaced apart from the second conductive layer in the first direction, and the fourth conductive layer being provided parallel to the substrate plane, a fifth conductive layer provided above the third conductive layer, the fifth conductive layer being spaced apart from the third conductive layer in the first direction, and the fifth conductive layer being provided parallel to the substrate plane, a sixth conductive layer provided above the fourth conductive layer, the sixth conductive layer being spaced apart from the fourth conductive layer in the first direction, and the sixth (Continued)

US 10,650,894 B2

Page 2 conductive layer being provided parallel to the substrate plane, an insulator provided between the first and second conductive layers, between the third and fourth conductive layers, and between the fifth and sixth conductive layers, a first signal line provided between the first, third, and fifth conductive layers and the insulator, the first signal line extending in the first direction, a second signal line provided between the second, fourth, and sixth conductive layers and the insulator, the second signal line extending in the first direction, a first memory cell provided between the first conductive layer and the first signal line, the first memory cell being configured to store first information, a second memory cell provided between the second conductive layer and the second signal line, the second memory cell being configured to store second information, a third memory cell provided between the third conductive layer and the first signal line, the third memory cell being configured to store third information, a fourth memory cell provided between the fourth conductive layer and the second signal line, the fourth memory cell being configured to store fourth information, a fifth memory cell provided between the fifth conductive layer and the first signal line, the fifth memory cell being configured to store fifth information, a sixth memory cell provided between the sixth conductive layer and the second signal line, the sixth memory cell being configured to store sixth information, and a control circuit configured to apply a second voltage to the third conductive layer, the control circuit being configured to apply a third voltage to the fifth conductive layer, the control circuit being configured to read data from the first memory cell, the second voltage being smaller than a first voltage, the first voltage being applied to the first conductive layer, and the third voltage being larger than the first voltage.

12 Claims, 5 Drawing Sheets

(51) Int. Cl.
*H01L 27/1157* (2017.01)
*H01L 27/11582* (2017.01)
(58) Field of Classification Search
USPC .......................... 365/185.01, 185.24
See application file for complete search history.

(56) References Cited

U.S. PATENT DOCUMENTS

| | | | |
|---|---|---|---|
| 8,039,886 B2 | 10/2011 | Mizukami et al. | |
| 8,238,159 B2 | 8/2012 | Morikado | |
| 8,358,537 B2 | 1/2013 | Morikado | |
| 9,029,938 B2 | 5/2015 | Nakaki | |
| 9,390,808 B1* | 7/2016 | Kato | G11C 16/3445 |
| 10,157,653 B1* | 12/2018 | Li | G11C 11/161 |
| 10,249,382 B2* | 4/2019 | Lee | G11C 29/44 |
| 10,276,248 B1* | 4/2019 | Lu | G11C 16/28 |
| 2005/0144361 A1* | 6/2005 | Gonzalez | G06F 12/0246 711/103 |
| 2008/0247072 A1* | 10/2008 | Nozieres | G11C 11/16 360/59 |
| 2009/0141545 A1* | 6/2009 | Norman | G11C 5/02 365/163 |
| 2010/0042774 A1* | 2/2010 | Yang | G06F 12/0246 711/103 |
| 2010/0120214 A1* | 5/2010 | Park | H01L 27/11578 438/287 |
| 2011/0134697 A1 | 6/2011 | Zhao et al. | |
| 2012/0206968 A1* | 8/2012 | Shiino | G11C 16/10 365/185.17 |
| 2013/0094294 A1 | 4/2013 | Kwak et al. | |
| 2013/0176790 A1* | 7/2013 | Nguyen | G11C 11/5628 365/185.19 |
| 2014/0063952 A1* | 3/2014 | Hara | G11C 16/0483 365/185.11 |
| 2014/0078814 A1* | 3/2014 | Shimakawa | G11C 13/0007 365/148 |
| 2015/0069499 A1 | 3/2015 | Nakaki | |
| 2015/0162093 A1* | 6/2015 | Oh | G11C 16/3445 365/185.11 |
| 2015/0262674 A1 | 9/2015 | Shirakawa | |
| 2015/0380097 A1* | 12/2015 | Sato | G11C 8/08 365/185.03 |
| 2016/0013200 A1* | 1/2016 | Yamashita | H01L 27/11582 257/316 |
| 2016/0055914 A1* | 2/2016 | Nam | G11C 16/10 365/185.25 |
| 2016/0125956 A1* | 5/2016 | Magia | G06F 3/0619 714/719 |
| 2017/0040341 A1* | 2/2017 | Kono | H01L 23/49827 |
| 2017/0242608 A1* | 8/2017 | Tailliet | G06F 3/061 |
| 2017/0256316 A1* | 9/2017 | Maejima | G11C 16/08 |
| 2018/0032271 A1* | 2/2018 | Seo | G06F 3/0619 |
| 2018/0143762 A1* | 5/2018 | Kim | G11C 11/5642 |
| 2018/0197586 A1* | 7/2018 | Nguyen | G11C 16/08 |
| 2018/0233185 A1* | 8/2018 | Futatsuyama | G11C 8/14 |
| 2018/0261620 A1* | 9/2018 | Lee | H01L 27/11582 |
| 2018/0286921 A1* | 10/2018 | Redaelli | G11C 11/5678 |
| 2018/0358102 A1* | 12/2018 | Zhang | G11C 16/3459 |
| 2019/0013063 A1* | 1/2019 | Liu | G11C 7/1057 |
| 2019/0067315 A1* | 2/2019 | Jiang | H01L 27/11575 |
| 2019/0080776 A1* | 3/2019 | Bushnaq | G11C 16/3459 |
| 2019/0259462 A1* | 8/2019 | Lu | G11C 16/30 |
| 2019/0272871 A1* | 9/2019 | Yang | G11C 11/5628 |
| 2019/0333587 A1* | 10/2019 | Kim | G11C 16/16 |
| 2019/0385658 A1* | 12/2019 | Lee | G11C 16/3459 |
| 2019/0385681 A1* | 12/2019 | Yun | G11C 16/16 |
| 2019/0386023 A1* | 12/2019 | Park | H01L 29/0847 |
| 2019/0392893 A1* | 12/2019 | Yang | G11C 11/5642 |
| 2019/0393268 A1* | 12/2019 | Lai | H01L 27/2481 |

FOREIGN PATENT DOCUMENTS

| | | |
|---|---|---|
| JP | 5198529 A | 5/2013 |
| JP | 2015-056452 A | 3/2015 |
| JP | 2015-176623 A | 10/2015 |

* cited by examiner

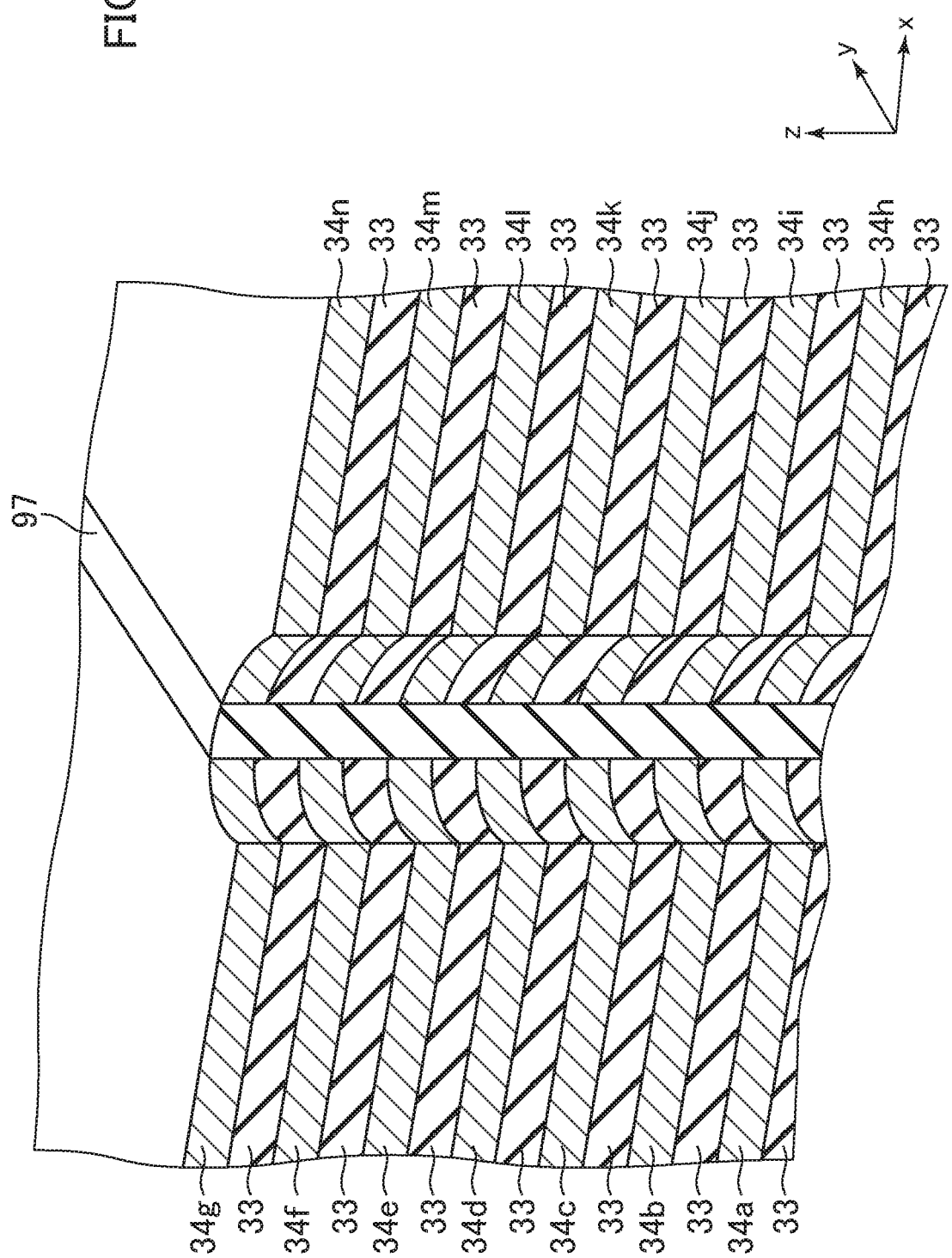

FIG.4A

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | VreadKK | $W_{LR(n+2)}$ (34m) | Vread |
| $W_{LL(n+1)}$ (34e) | VreadK | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | Vread | $W_{LR(n-1)}$ (34j) | Vcount |
| $W_{LL(n-2)}$ (34b) | Vread | $W_{LR(n-2)}$ (34i) | Vread |
| $W_{LL(n-3)}$ (34a) | Vread | $W_{LR(n-3)}$ (34h) | Vread |

FIG.4B

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | Vread | $W_{LR(n+2)}$ (34m) | Vread |
| $W_{LL(n+1)}$ (34e) | Vread | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | Vread |
| $W_{LL(n-3)}$ (34a) | Vread | $W_{LR(n-3)}$ (34h) | Vread |

FIG.4C

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | VreadKK | $W_{LR(n+2)}$ (34m) | Vread |
| $W_{LL(n+1)}$ (34e) | VreadK | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | Vread |
| $W_{LL(n-3)}$ (34a) | Vread | $W_{LR(n-3)}$ (34h) | Vread |

FIG.4D

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | Vread | $W_{LR(n+2)}$ (34m) | Vread |
| $W_{LL(n+1)}$ (34e) | Vread | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | VreadKK |
| $W_{LL(n-3)}$ (34a) | Vread | $W_{LR(n-3)}$ (34h) | Vread |

FIG.4E

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | Vread | $W_{LR(n+2)}$ (34m) | Vread |
| $W_{LL(n+1)}$ (34e) | Vread | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | VreadK |
| $W_{LL(n-2)}$ (34b) | VreadKK | $W_{LR(n-2)}$ (34i) | VreadKK |
| $W_{LL(n-3)}$ (34a) | Vread | $W_{LR(n-3)}$ (34h) | Vread |

FIG.4F

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | Vread | $W_{LR(n+2)}$ (34m) | VreadKK |
| $W_{LL(n+1)}$ (34e) | Vread | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | Vread |
| $W_{LL(n-3)}$ (34a) | Vread | $W_{LR(n-3)}$ (34h) | Vread |

FIG.4G

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | Vread | $W_{LR(n+2)}$ (34m) | VreadKK |
| $W_{LL(n+1)}$ (34e) | Vread | $W_{LR(n+1)}$ (34l) | VreadK |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | Vread |
| $W_{LL(n-3)}$ (34a) | Vread | $W_{LR(n-3)}$ (34h) | Vread |

FIG.4H

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | Vread | $W_{LR(n+2)}$ (34m) | VreadKK |
| $W_{LL(n+1)}$ (34e) | Vread | $W_{LR(n+1)}$ (34l) | VreadK |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | VreadK |
| $W_{LL(n-2)}$ (34b) | VreadKK | $W_{LR(n-2)}$ (34i) | VreadKK |
| $W_{LL(n-3)}$ (34a) | Vread | $W_{LR(n-3)}$ (34h) | Vread |

FIG.5A

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | VreadKK | $W_{LR(n+2)}$ (34m) | Vread |
| $W_{LL(n+1)}$ (34e) | VreadK | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | VreadKK |
| $W_{LL(n-3)}$ (34a) | Vread | $W_{LR(n-3)}$ (34h) | Vread |

FIG.5B

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | VreadKK | $W_{LR(n+2)}$ (34m) | Vread |
| $W_{LL(n+1)}$ (34e) | VreadK | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | VreadK |
| $W_{LL(n-2)}$ (34b) | VreadKK | $W_{LR(n-2)}$ (34i) | VreadKK |
| $W_{LL(n-3)}$ (34a) | Vread | $W_{LR(n-3)}$ (34h) | Vread |

FIG.5C

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | VreadKK | $W_{LR(n+2)}$ (34m) | VreadKK |
| $W_{LL(n+1)}$ (34e) | VreadK | $W_{LR(n+1)}$ (34l) | Vcount |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | Vread |
| $W_{LL(n-3)}$ (34a) | Vread | $W_{LR(n-3)}$ (34h) | Vread |

FIG.5D

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | VreadKK | $W_{LR(n+2)}$ (34m) | VreadKK |
| $W_{LL(n+1)}$ (34e) | VreadK | $W_{LR(n+1)}$ (34l) | VreadK |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | Vcount |
| $W_{LL(n-2)}$ (34b) | VreadKK | $W_{LR(n-2)}$ (34i) | Vread |
| $W_{LL(n-3)}$ (34a) | Vread | $W_{LR(n-3)}$ (34h) | Vread |

FIG.5E

| WL | Voltage | WL | Voltage |
|---|---|---|---|
| $W_{LL(n+3)}$ (34g) | Vread | $W_{LR(n+3)}$ (34n) | Vread |
| $W_{LL(n+2)}$ (34f) | VreadKK | $W_{LR(n+2)}$ (34m) | VreadKK |
| $W_{LL(n+1)}$ (34e) | VreadK | $W_{LR(n+1)}$ (34l) | VreadK |
| $W_{LL(n)}$ (34d) | Vsense | $W_{LR(n)}$ (34k) | Vcount |
| $W_{LL(n-1)}$ (34c) | VreadK | $W_{LR(n-1)}$ (34j) | VreadK |
| $W_{LL(n-2)}$ (34b) | VreadKK | $W_{LR(n-2)}$ (34i) | VreadKK |
| $W_{LL(n-3)}$ (34a) | Vread | $W_{LR(n-3)}$ (34h) | Vread |

SEMICONDUCTOR MEMORY DEVICE AND CONTROL METHOD THEREOF

CROSS-REFERENCE TO RELATED APPLICATION

This application is based upon and claims the benefit of priority from Japanese Patent Application No. 2018-175464, filed on Sep. 19, 2018, the entire contents of which are incorporated herein by reference.

FIELD

Embodiments described herein relate generally to a semiconductor memory device and a control method thereof.

BACKGROUND

High-capacity nonvolatile memory is under active development. This type of memory is capable of low voltage/low current operation, high-speed switching, and memory cell downscaling/high integration.

A high-capacity memory array has a large number of metal wiring lines, called bit lines and word lines, arranged therein. To write to a single memory cell, voltage is applied to a bit line and a word line connected to the cell. Memory devices in which memory cells are arranged three-dimensionally have been proposed using a stacked body in which insulating layers and conductive layers serving as word lines are alternatingly stacked.

Further, by, for example, providing an insulator that passes through the memory cells and the word lines to separate the memory cells and the word lines, the capacity of the memory array can be increased. However, in the cases where such an insulator is provided, parasitic transistors are formed by adjacent pluralities of word lines and the insulator. Thus, when writing to a memory cell is performed, the respective parasitic transistor is switched ON, current flows between adjacent word lines, and insufficient current flows to the memory cell.

Consequently, there has been an issue that memory cell current does not increase, and a threshold voltage of the memory cell does not increase.

BRIEF DESCRIPTION OF THE DRAWINGS

FIG. 3 is a schematic view of conductive layers and insulators in the semiconductor memory device of the embodiments;

FIGS. 4A to 4H list voltages applied to conductive layers in the semiconductor memory device of the embodiments when data is read from a memory cell; and FIGS. 5A to 5E list voltages applied to conductive layers in the semiconductor memory device of the embodiments when data is read from a memory cell.

DETAILED DESCRIPTION

Figure 1:
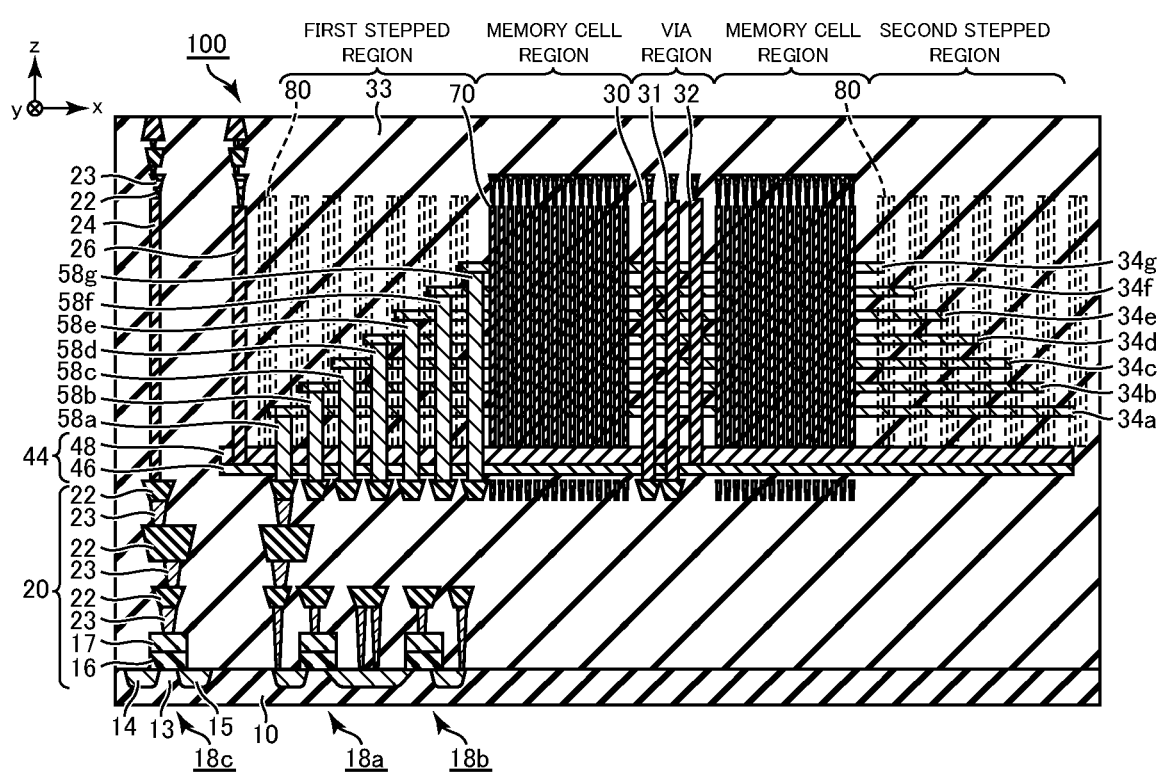
FIG. 1 is a schematic cross-sectional view of a semiconductor memory device of embodiments.

The embodiments will be described below with reference to the drawings. Note that identical or similar reference numerals will be given to portions that are identical or similar.

In the present specification, in order to illustrate positional relationships among components, an upward direction in the drawings is denoted "above" and a downward direction in the drawings is denoted "below". In the present specification, the concepts "above" and "below" are not necessarily terms indicating a relationship with the direction of gravity.

First Embodiment

A semiconductor memory device of the present embodiment includes a substrate, a first conductive layer provided above the substrate, the first conductive layer being spaced apart from the substrate in a first direction, and the first conductive layer being provided parallel to a substrate plane, a second conductive layer provided adjacent to the first conductive layer in a second direction intersecting the first direction, the second conductive layer being provided parallel to the substrate plane, a third conductive layer provided above the first conductive layer, the third conductive layer being spaced apart from the first conductive layer in the first direction, and the third conductive layer being provided parallel to the substrate plane, a fourth conductive layer provided above the second conductive layer, the fourth conductive layer being spaced apart from the second conductive layer in the first direction, and the fourth conductive layer being provided parallel to the substrate plane, a fifth conductive layer provided above the third conductive layer, the fifth conductive layer being spaced apart from the third conductive layer in the first direction, and the fifth conductive layer being provided parallel to the substrate plane, a sixth conductive layer provided above the fourth conductive layer, the sixth conductive layer being spaced apart from the fourth conductive layer in the first direction, and the sixth conductive layer being provided parallel to the substrate plane, an insulator provided between the first and second conductive layers, between the third and fourth conductive layers, and between the fifth and sixth conductive layers, a first signal line provided between the first, third, and fifth conductive layers and the insulator, the first signal line extending in the first direction, a second signal line provided between the second, fourth, and sixth conductive layers and the insulator, the second signal line extending in the first direction, a first memory cell provided between the first conductive layer and the first signal line, the first memory cell being configured to store first information, a second memory cell provided between the second conductive layer and the second signal line, the second memory cell being configured to store second information, a third memory cell provided between the third conductive layer and the first signal line, the third memory cell being configured to store third information, a fourth memory cell provided between the fourth conductive layer and the second signal line, the fourth memory cell being configured to store fourth information, a fifth memory cell provided between the fifth conductive layer and the first signal line, the fifth memory cell being configured to store fifth information, a sixth memory cell provided between the sixth conductive layer and the second signal line, the sixth memory cell being configured to store sixth information, and a control circuit configured to apply a second voltage to the third conductive layer, the control circuit being configured to apply a third voltage to the fifth conductive layer, the control circuit being configured to read data from the first memory cell, the second voltage being smaller than the first voltage, the first voltage being applied to the first conductive layer, and the third voltage being more than the first voltage.

Herein, as described below, a z direction is an example of a first direction, an x direction is an example of a second direction, a conductive layer 34d is an example of a first conductive layer, a conductive layer 34k is an example of a second conductive layer, a conductive layer 34e is an example of a third conductive layer, a conductive layer 34l is an example of a fourth conductive layer, a conductive layer 34f is an example of a fifth conductive layer, a conductive layer 34m is an example of a sixth conductive layer, a conductive layer 34c is an example of a seventh conductive layer, a conductive layer 34b is an example of an eighth conductive layer, a conductive layer 34j is an example of a ninth conductive layer, and a conductive layer 34i is an example of a tenth conductive layer.

A control method for a semiconductor memory device of the present embodiment is for a semiconductor memory device, the device using a substrate, a plate-like first conductive layer provided above the substrate, the first conductive layer being spaced apart from the substrate, and the first conductive layer being provided parallel to a substrate plane, a plate-like second conductive layer provided above the first conductive layer, the second conductive layer being spaced apart from the first conductive layer, and the second conductive layer being provided parallel to the substrate plane, a plate-like third conductive layer provided above the second conductive layer, the third conductive layer being spaced apart from the second conductive layer, and the third conductive layer being provided parallel to the substrate plane, an insulator provided passing through the first, second, and third conductive layers, a channel body provided between the first, second, and third conductive layers and the insulator, the channel body extending toward the substrate plane, and a memory cell provided between the first conductive layer and the channel body, the memory cell having a charge storing film. The control method includes applying a second voltage to the second conductive layer, applying a third voltage to the third conductive layer, and reading data from the memory cell, the second voltage being smaller than a first voltage, and the third voltage being larger than the first voltage.

Figure 2:
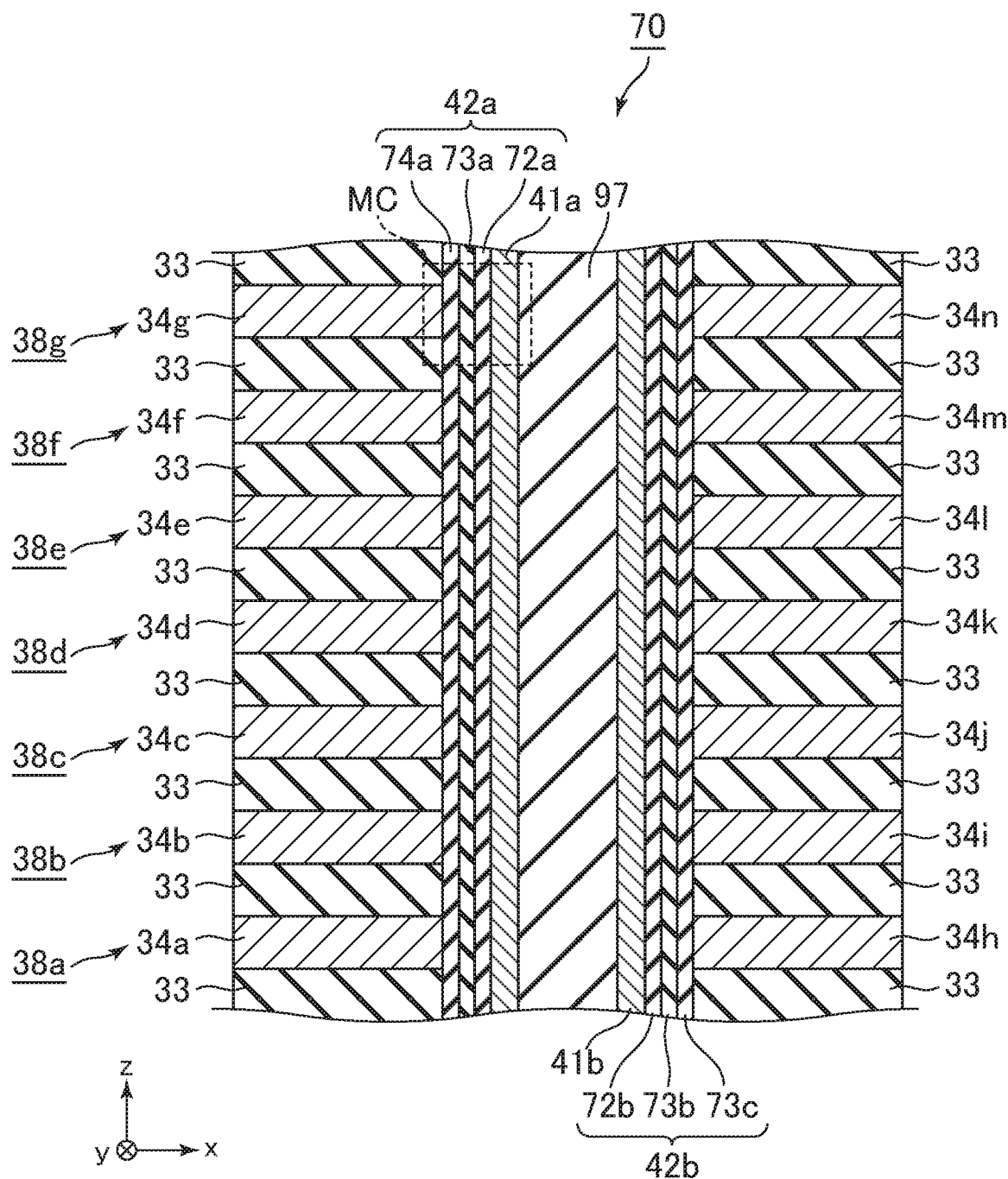
FIG. 2 is a schematic view of conductive layers and insulators in the vicinity of memory holes of the semiconductor memory device of the embodiments.

FIG. 1 is a schematic cross-sectional view of a semiconductor memory device of the embodiments. FIG. 2 is a schematic view of conductive layers and insulators in the vicinity of memory cells of the semiconductor memory device of the embodiments.

A semiconductor memory device 100 of the embodiments is a three-dimensional NAND flash memory in which memory cells have been disposed three-dimensionally. The semiconductor memory device 100 is provided with a plurality of word lines WL, a common source line CSL, a source select gate line SGS, a plurality of drain select gate lines SGD, a plurality of bit lines BL, and a plurality of memory strings MS. The memory string MS include a source select transistor STS, a plurality of memory cell transistors MT, and a drain select transistor STD, which are connected in series between the common source line CSL and the bit lines BL. Note that the source select gate line SGS, the drain select gate lines SGD, the source select transistor STS, the drain select transistor STD, and the bit lines BL are not illustrated in FIG. 1. Further, an insulator 97 is not illustrated in FIG. 1. Further, barrier metals are not depicted in FIGS. 1 and 2.

A substrate 10 is, for example, a semiconductor substrate. The substrate 10 is, for example, a silicon substrate.

Here, an x direction, a y direction which is one of the directions perpendicular to the x direction, and a z direction which is one of the directions perpendicular to the x direction and the y direction, are defined. In FIG. 1, the substrate 10 is disposed such that the substrate plane is provided parallel to the xy plane.

A plurality of transistors 18 are provided to the substrate 10. For example, transistors 18a, 18b, and 18c are provided to the substrate 10. Each of the transistors 18a, 18b, and 18c has a source region 14 provided in an upper layer portion of the substrate 10, a drain region 15 provided in the upper layer portion of the substrate 10, a semiconductor region 13 provided in the upper layer portion of the substrate 10 between the source region 14 and the drain region 15, a gate insulating film 16 provided on the semiconductor region 13, and a gate electrode 17 provided on the gate insulating film 16. The transistors 18a, 18b, and 18c are, for example, field-effect transistors. The transistors 18a, 18b, and 18c are examples of semiconductor elements. In the example of FIG. 1, the transistors 18a, 18b, and 18c are, for example, illustrated as a plurality of transistors 18.

An insulating layer 33 is provided on the substrate 10. The insulating layer 33 contains, for example, silicon oxide.

A control circuit 20 is provided within the substrate 10 and within the insulating layer 33. The control circuit 20 includes the plurality of transistors 18, contacts 23 that are electrically connected to the plurality of transistors 18, and wiring lines 22 that are electrically connected to the contacts 23. The control circuit 20 is employed to drive the three-dimensional NAND flash memory. Note that the control circuit 20 may, for example, be provided outside the semiconductor memory device 100.

A buried source line 44 is provided above the control circuit 20. The buried source line 44 includes, for example, a buried source line lower layer portion 46 containing tungsten (W), and a buried source line upper layer portion 48 containing polysilicon. The buried source line 44 is supplied with an electric potential from the control circuit 20. The buried source line 44 corresponds to the common source line CSL in FIG. 1.

Above the substrate 10, a plurality of plate-like conductive layers 34 extending parallel to the plane of the substrate 10 are provided spanning a first stepped region, a memory cell region, a via region, another memory cell region, and a second stepped region. For example, conductive layers 34a, 34b, 34c, 34d, 34e, 34f, 34g, 34h, 34i, 34j, 34k, 34l, 34m, and 34n are stacked above the substrate with the insulating layer 33 interposed therebetween. Note that the conductive layers 34h, 34i, 34j, 34k, 34l, 34m, and 34n are not illustrated in FIG. 1. Specifically, the conductive layers 34 are disposed as follows.

The conductive layer 34a is provided above the substrate 10 and provided parallel to the substrate plane. The conductive layer 34b is provided above the conductive layer 34a and provided parallel to the substrate plane. The conductive layer 34c is provided above the conductive layer 34b and provided parallel to the substrate plane. The conductive layer 34d is provided above the conductive layer 34c and provided parallel to the substrate plane. The conductive layer 34e is provided above the conductive layer 34d and provided parallel to the substrate plane. The conductive layer 34f is provided above the conductive layer 34e and provided parallel to the substrate plane.

The insulator 97 is provided between the conductive layers 34a, 34b, 34c, 34d, 34e, 34f, and 34g and the conductive layers 34h, 34i, 34j, 34k, 34l, 34m, and 34n. The insulator 97 separates the conductive layers 34a, 34b, 34c, 34d, 34e, 34f, and 34g, the conductive layers 34h, 34i, 34j, 34k, 34l, 34m, and 34n, and memory holes 70, along a direction perpendicular to the substrate plane.

The conductive layers 34a, 34b, 34c, 34d, 34e, 34f, 34g, 34h, 34i, 34j, 34k, 34l, 34m, and 34n function as word lines WL.

Although there are seven conductive layers 34 in the semiconductor memory device 100 of the embodiments, the number of conductive layers 34 is not limited thereto.

Electrode members 58 are provided in the first stepped region. In the example of FIG. 1, for example, electrode members 58a, 58b, 58c, 58d, 58e, 58f, and 58g are provided. Each of the electrode members 58 functions as a contact that connects the control circuit 20 to the corresponding conductive layer 34.

The electrode member 58a is connected to the conductive layer 34a at a position where the conductive layer 34a protrudes from the conductive layers 34b, 34c, 34d, 34e, 34f, and 34g in the first stepped region. The electrode member 58a extends toward the substrate 10 (here, "substrate" includes the control circuit 20 formed on the substrate 10) from the conductive layer 34a.

The electrode member 58b is connected to the conductive layer 34b at a position where the conductive layer 34b protrudes from the conductive layers 34c, 34d, 34e, 34f, and 34g in the first stepped region. The electrode member 58b extends toward the substrate 10 (here, "substrate" includes the control circuit 20 formed on the substrate 10) from the conductive layer 34b, and passes through the conductive layer 34a provided below the conductive layer 34b.

The electrode member 58c is connected to the conductive layer 34c at a position where the conductive layer 34c protrudes from the conductive layers 34d, 34e, 34f, and 34g in the first stepped region. The electrode member 58c extends toward the substrate 10 (here, "substrate" includes the control circuit 20 formed on the substrate 10) from the conductive layer 34c, and passes through the conductive layers 34a and 34b provided below the conductive layer 34c.

The electrode member 58d is connected to the conductive layer 34d at a position where the conductive layer 34d protrudes from the conductive layers 34e, 34f, and 34g in the first stepped region. The electrode member 58d extends toward the substrate 10 (here, "substrate" includes the control circuit 20 formed on the substrate 10) from the conductive layer 34d, and passes through the conductive layers 34a, 34b, and 34c provided below the conductive layer 34d.

The electrode member 58e is connected to the conductive layer 34e at a position where the conductive layer 34e protrudes from the conductive layers 34f and 34g in the first stepped region. The electrode member 58e extends toward the substrate 10 (here, "substrate" includes the control circuit 20 formed on the substrate 10) from the conductive layer 34e, and passes through the conductive layers 34a, 34b, 34c, and 34d provided below the conductive layer 34e.

The electrode member 58f is connected to the conductive layer 34f at a position where the conductive layer 34f protrudes from the conductive layers and 34g in the first stepped region. The electrode member 58f extends toward the substrate 10 (here, "substrate" includes the control circuit 20 formed on the substrate 10) from the conductive layer 34f, and passes through the conductive layers 34a, 34b, 34c, 34d, and 34e provided below the conductive layer 34f.

The electrode member 58g is connected to the conductive layer 34g in the first stepped region. The electrode member 58g extends toward the substrate 10 (here, "substrate" includes the control circuit 20 formed on the substrate 10) from the conductive layer 34g, and passes through the conductive layers 34a, 34b, 34c, 34d, 34e, and 34f provided below the conductive layer 34g.

Note that non-illustrated electrode members 58 are respectively connected to the conductive layers 34h, 34i, 34j, 34k, 34l, 34m, and 34n, and, for example, extend toward the substrate 10 (here, "substrate" includes the control circuit 20 formed on the substrate 10).

It is preferable to employ tungsten, titanium nitride, or copper, for example, as a material for the conductive layers 34. Note that another metal, a metallic semiconductor compound, a semiconductor, or other conductive material may be employed for the conductive layers 34.

It is preferable to employ tungsten, titanium nitride, or copper, for example, as a material for the electrode members 58. Note that another metal, a metallic semiconductor compound, a semiconductor, or other conductive material may be employed for the electrode members.

The memory holes 70 pass through the conductive layers 34 in the memory cell region.

Vias 30, 31, and 32 are provided in the via region. The vias 30 and 31 pass through the conductive layers 34 and the buried source line 44, and, for example, are electrically connected to the wiring lines 22. The via 32 passes through the conductive layers 34, and, for example, is electrically connected to the buried source line 44. A barrier metal film and an insulating film, which are not illustrated, are provided around the vias 30, 31, for example. The barrier metal film and the insulating film electrically insulate the conductive layers 34 and the buried source line 44. A barrier metal film and an insulating film, which are not illustrated, are provided around the via 32, for example. The barrier metal film and the insulating film electrically insulate the conductive layers 34.

It is preferable to employ tungsten, for example, as a material for the vias 30, 31, and 32.

The electrode members 58 are electrically connected to the transistor 18a and the transistor 18b through the wiring lines 22 and the contacts 23.

The buried source line 44 and a via 26 connected to the buried source line 44 are electrically connected to a non-illustrated transistor (an element similar to the transistors 18) through the wiring lines 22 and the contacts 23.

Reinforcement members 80 extend perpendicular to the substrate 10 plane in the first stepped region and the second stepped region. It is preferable to employ silicon oxide, for example, as a material for the reinforcement members 80. For example, first a silicon nitride layer is formed instead of the respective conductive layer 34, and then this silicon nitride layer is replaced with the conductive layer 34. At this time, temporarily, in order to perform hollowing, the reinforcement members 80 are disposed to maintain a stacked structure.

As illustrated in FIG. 2, a channel body 41a (an example of a first channel body and first signal line) is provided between the conductive layers 34a, 34b, 34c, 34d, 34e, 34f, and 34g and the insulator 97 which is extending along the z direction. The channel body 41a extends along the z direction toward the substrate plane. A channel body 41b (an example of a second channel body and second signal line) is provided between the conductive layers 34h, 34i, 34j, 34k, 34l, 34m, and 34n and the insulator 97, and extends along the z direction toward the substrate plane. The channel bodies 41 are pillars containing, for example, a semiconductor material such as silicon. The channel bodies 41 are electrically connected to the buried source line 44.

A tunnel insulating film 72a is provided between the conductive layers 34a, 34b, 34c, 34d, 34e, 34f, and 34g and the channel body 41a. A tunnel insulating film 72b is provided between the conductive layers 34h, 34i, 34j, 34k, 34*l*, 34*m*, and 34*n* and the channel body 41*b*. Although the tunnel insulating film 72*a* and the tunnel insulating film 72*a* have insulating properties, the tunnel insulating film 72*a* and the tunnel insulating film 72*b* are insulating films through which current flows due to application of a predetermined voltage. The tunnel insulating films 72 contain, for example, silicon oxide.

A charge storing film 73*a* is provided between the conductive layers 34*a*, 34*b*, 34*c*, 34*d*, 34*e*, 34*f*, and 34*g* and the tunnel insulating film 72*a*. A charge storing film 73*b* is provided between the conductive layers 34*h*, 34*i*, 34*j*, 34*k*, 34*l*, 34*m*, and 34*n* and the tunnel insulating film 72*b*. The charge storing films 73*a* and 73*b* are films containing a material capable of storing an electric charge. The charge storing films 73*a* and 73*b* contain, for example, silicon nitride.

A block insulating film 74*a* is provided between the conductive layers 34*a*, 34*b*, 34*c*, 34*d*, 34*e*, 34*f*, and 34*g* and the charge storing film 73*a*. A block insulating film 74*b* is provided between the conductive layers 34*h*, 34*i*, 34*j*, 34*k*, 34*l*, 34*m*, and 34*n* and the charge storing film 73*b*. The block insulating films 74*a* and 74*b* are films that suppress flow of electric charge between the charge storing films 73*a* and 73*b* and the conductive layers 34. The block insulating film 74*a* and 74*b* contain, for example, silicon oxide.

A memory film 42*a* includes the tunnel insulating film 72*a*, the charge storing film 73*a*, and the block insulating film 74*a*. A memory film 42*b* includes the tunnel insulating film 72*b*, the charge storing films 73*a* and 73*b*, and the block insulating film 74*a* and 74*b*.

A region indicated by a dashed line in FIG. 2 is a single memory cell MC.

The conductive layer 34*a*, the memory film 42*a*, and the channel body 41*a*, for example, configure a single memory cell transistor MT. Similarly, the conductive layer 34*b*, memory film 42*a*, and channel body 41*a*, the conductive layer 34*c*, memory film 42*a*, and channel body 41*a*, the conductive layer 34*d*, memory film 42*a*, and channel body 41*a*, the conductive layer 34*e*, memory film 42*a*, and channel body 41*a*, the conductive layer 34*f*, memory film 42*a*, and channel body 41*a*, and the conductive layer 34*g*, memory film 42*a*, and channel body 41*a*, each configure a single memory cell transistor MT. The memory cells MC configured by these memory cell transistors MT are included in a single memory string MS.

The conductive layer 34*h*, the memory film 42*b*, and the channel body 41*b*, for example, also configure a single memory cell transistor MT. Similarly, the conductive layer 34*i*, memory film 42*b*, and channel body 41*b*, the conductive layer 34*j*, memory film 42*b*, and channel body 41*b*, the conductive layer 34*k*, memory film 42*b*, and channel body 41*b*, the conductive layer 34*l*, memory film 42*b*, and channel body 41*b*, the conductive layer 34*m*, memory film 42*b*, and channel body 41*b*, and the conductive layer 34*n*, memory film 42*b*, and channel body 41*b*, each configure a single memory cell transistor MT. The memory cells MC configured by these memory cell transistors MT are included in a single memory string MS. Thus, two memory strings MS are included in each memory hole 70.

FIG. 3 is a schematic view of conductive layers and insulators in the semiconductor memory device of the embodiments. The channel bodies 41*a* and 41*b* in the memory hole 70, the memory films 42*a* and 42*b* in the memory hole 70, and the insulator 97 projecting into the memory hole 70 are not illustrated in FIG. 3. The insulator 97 extends toward the conductive layers 34 from the memory hole 70, and separates the conductive layers 34*a*, 34*b*, 34*c*, 34*d*, 34*e*, 34*f*, and 34*g* and the conductive layers 34*h*, 34*i*, 34*j*, 34*k*, 34*l*, 34*m*, and 34*n*.

Note that barrier metals are not depicted in FIG. 3.

FIGS. 4A to 4H list voltages applied to conductive layers in the semiconductor memory device of the embodiments when data is read from a memory cell.

First, the present embodiment will be described with reference to FIG. 4A. In one mode of the present disclosure, data is read from a memory cell MC configured by the conductive layer 34*a*, the memory film 42*a*, and the channel body 41*a*. In FIG. 4A, $W_{LL(n-3)}$, for example, refers to the word line corresponding to the conductive layer 34*a*. Further, "Vread" to the right of $W_{LL(n-3)}$ refers to a voltage "Vread" applied to the $W_{LL(n-3)}$ when data is read from the memory cell MC configured by the conductive layer 34*a*, the memory film 42*a*, and the channel body 41*a*. Note that the letter "n" appended to word lines $W_{LL}$ and $W_{LR}$ is a freely selected natural number.

A predetermined readout voltage Vsense is applied to $W_{LL(n)}$ (the conductive layer 34*d*) configuring part of the memory cell MC from which data is to be read.

A predetermined positive voltage Vread (an example of a first voltage) is applied to $W_{LL(n-1)}$ (the conductive layer 34*c*), $W_{LL(n-2)}$ (the conductive layer 34*b*), $W_{LL(n-3)}$ (the conductive layer 34*a*), $W_{LR(n-3)}$ (the conductive layer 34*h*), $W_{LR(n-2)}$ (the conductive layer 34*i*), $W_{LR(n+2)}$ (the conductive layer 34*m*), and $W_{LR(n+3)}$ (the conductive layer 34*n*).

A voltage VreadK (an example of a second voltage) smaller than Vread is applied to $W_{LL(n+1)}$ (the conductive layer 34*e*). Further, a voltage VreadKK (an example of a third voltage) larger than Vread is applied to $W_{LL(n+2)}$ (the conductive layer 34*f*).

A predetermined voltage Vcount is applied to $W_{LR(n-1)}$ (the conductive layer 34*j*), $W_{LR(n)}$ (the conductive layer 34*k*), and $W_{LR(n+1)}$ (the conductive layer 34*l*). Vcount is a predetermined negative voltage.

Applying voltage to the conductive layers 34 is, for example, performed through the electrode members 58 using the control circuit 20.

Next, a function and effect of the mode for the present embodiment set forth in FIG. 4A will be described.

With a semiconductor memory device such as in the present embodiment, in which memory holes 70 and conductive layers 34 are separated by an insulator 97, a density of memory cells MC can be increased.

However, parasitic transistors are formed at ends of the separated conductive layers 34 described above. To give an example, taking either the conductive layer 34*d* or the conductive layer 34*e* as a source electrode or a drain electrode, a parasitic transistor is formed having a channel in the vicinity of an area between the insulator 97 and the insulating layer 33. If this parasitic transistor is switched ON, there is an issue that memory cell current flows to the adjacent conductive layers 34, and so the memory cell current will be insufficient, and the threshold voltage of the memory cell MC cannot be increased.

Accordingly, in the semiconductor memory device of the mode for the present embodiment set forth in FIG. 4A, a voltage VreadK smaller than Vread is applied to $W_{LL(n+1)}$ (the conductive layer 34*e*). $W_{LL(n+1)}$ is a conductive layer adjacent to $W_{LL(n)}$ (the conductive layer 34*d*). As a result, the parasitic transistor formed between $W_{LL(n+1)}$ (the conductive layer 34*e*) and $W_{LL(n)}$ (the conductive layer 34*d*) is switched OFF, and a reduction in memory cell current can be suppressed and a drop in the threshold voltage of the memory cell MC can be suppressed.

Further, a voltage VreadKK larger than Vread is applied to $W_{LL(n+2)}$ (the conductive layer 34f). As a result, in contrast to the case for $W_{LL(n+1)}$ (the conductive layer 34e), the parasitic transistor between the $W_{LL(n+2)}$ (the conductive layer 34f) and $W_{LL(n)}$ (the conductive layer 34d) is switched ON, and memory cell current can be increased and the threshold voltage of the memory cell MC can be increased.

The present embodiment can provide a semiconductor memory device having larger memory cell currents and higher threshold voltages. The present embodiment can also provide a control method for a semiconductor memory device having larger memory cell currents and higher threshold voltages.

Second Embodiment

The present embodiment will be described with reference to FIG. 4B. A voltage Vread is applied to $W_{LL(n+2)}$ (the conductive layer 34f) and $W_{LL(n+1)}$ (the conductive layer 34e). Meanwhile, VreadK is applied to $W_{LL(n-1)}$ (the conductive layer 34c), and VreadKK is applied to $W_{LL(n-2)}$ (the conductive layer 34b). As a result, the parasitic transistor formed between $W_{LL(n-1)}$ (the conductive layer 34c) and $W_{LL(n)}$ (the conductive layer 34d) is switched OFF and the parasitic transistor formed between the the $W_{LL(n-2)}$ (the conductive layer 34b) and $W_{LL(n)}$ (the conductive layer 34d) is switched ON, and memory cell current can be increased and the threshold voltage of the memory cell MC can be increased.

The present embodiment can also provide a semiconductor memory device having larger memory cell currents and higher threshold voltages. The present embodiment can also provide a control method for a semiconductor memory device having larger memory cell currents and higher threshold voltages.

Third Embodiment

A semiconductor memory device of the present embodiment differs from that of the first embodiment in that it further includes a plate-like fourth conductive layer 34c provided between the substrate and the first conductive layer, the fourth conductive layer 34c being provided parallel to the substrate plane, the fourth conductive layer 34c being, and a plate-like fifth conductive layer 34b provided between the substrate and the fourth conductive layer, the fifth conductive layer 34b being provided parallel to the substrate plane, the insulator further passes through the fourth and fifth conductive layers, the channel body is further provided between the fourth and fifth conductive layers and the insulator, and the control circuit is configured to apply a fourth voltage to the fourth conductive layer, the control circuit is configured to apply a fifth voltage to the fifth conductive layer, the control circuit is configured to read data from a memory cell, the fourth voltage is smaller than the first voltage, and the fifth voltage is larger than the first voltage. Here, features overlapping with that in the first embodiment or the second embodiment will not be described.

The present embodiment will be described with reference to FIG. 4C. A voltage VreadK (an example of a fourth voltage) smaller than Vread is applied to $W_{LL(n-1)}$ (the conductive layer 34c). A voltage VreadKK (an example of a fifth voltage) larger than Vread is applied to $W_{LL(n-2)}$ (the conductive layer 34b). VreadK is applied to $W_{LL(n+1)}$ (the conductive layer 34e). VreadKK is applied to $W_{LL(n+2)}$ (the conductive layer 34f).

The mode set forth in FIG. 4C enables the effects of both the first embodiment (FIG. 4A) and the second embodiment (FIG. 4B) to be obtained.

The present embodiment can also provide a semiconductor memory device having larger memory cell currents and higher threshold voltages. The present embodiment can also provide a control method for a semiconductor memory device having larger memory cell currents and higher threshold voltages.

Fourth Embodiment

Here, features overlapping with that in the first to third embodiments will not be described. The present embodiment will be described with reference to FIG. 4D. $W_{LL(n-3)}$ (the conductive layer 34a), $W_{LL(n-2)}$ (the conductive layer 34b), $W_{LL(n-1)}$ (the conductive layer 34c), $W_{LL(n)}$ (the conductive layer 34d), $W_{LL(n+1)}$ (the conductive layer 34e), $W_{LL(n+2)}$ (the conductive layer 34f), and $W_{LL(n+3)}$ (the conductive layer 34g) are treated similarly to in the first embodiment depicted in FIG. 4A. Meanwhile, VreadKK is applied to $W_{LR(n-2)}$.

In the present embodiment, the voltages applied to the conductive layers 34 provided on an opposite side of the insulator 97 are controlled. VreadKK is applied to $W_{LR(n-2)}$ (the conductive layer 34i), enabling a further increase in memory cell current and a further increase in threshold voltage.

The present embodiment can also provide a semiconductor memory device having larger memory cell currents and higher threshold voltages. The present embodiment can also provide a control method for a semiconductor memory device having larger memory cell currents and higher threshold voltages.

Fifth Embodiment

A semiconductor memory device of the present embodiment includes a substrate, a plate-like first conductive layer 34d provided above the substrate, the first conductive layer 34d being provided at a first level 38d provided spaced apart from the substrate, and the first conductive layer 34d being provided parallel to a substrate plane, a plate-like second conductive layer 34k provided at the first level, the second conductive layer 34k being provided spaced apart from the first conductive layer, and the second conductive layer 34k being provided parallel to the substrate plane, a plate-like third conductive layer 34e provided at a second level 38e disposed above the first level, the second level 38e being spaced apart from the first level, the third conductive layer 34e being provided above the first conductive layer, and the third conductive layer 34e being provided parallel to the substrate plane, a plate-like fourth conductive layer 34l provided at the second level, the fourth conductive layer 34l being provided above the second conductive layer, and the fourth conductive layer 34l being provided parallel to the substrate plane, a plate-like fifth conductive layer 34f provided at a third level 38f disposed above the second level, the third level 38f being spaced apart from the second level, the fifth conductive layer 34f being provided above the second conductive layer, and the fifth conductive layer 34f being provided parallel to the substrate plane, a plate-like sixth conductive layer 34m provided at the third level, the sixth conductive layer 34m being provided above the fourth conductive layer, and the sixth conductive layer 34m being provided parallel to the substrate plane, an insulator provided between the first, second, and third conductive layers and the fourth, fifth, and sixth conductive layers, a first channel body provided between the first, second, and third conductive layers and the insulator, the first channel body extending toward the substrate plane, a second channel body provided between the fourth, fifth, and sixth conductive layers and the insulator, the second channel body extending toward the substrate plane, a memory cell provided between the first conductive layer and the first channel body, the memory cell having a charge storing film, and a control circuit configured to apply a second voltage to the fourth conductive layer, the control circuit being configured to apply a third voltage to the sixth conductive layer, the control circuit being configured to read data from the memory cell, the second voltage being smaller than a first voltage, and the third voltage being larger than the first voltage. Here, features overlapping with that in the first to fourth embodiments will not be described.

The present embodiment will be described with reference to FIG. 4E. Adding to the fourth embodiment, VreadK is applied to $W_{LR(n-1)}$ (the conductive layer 34$j$).

The present embodiment can also provide a semiconductor memory device having larger memory cell currents and higher threshold voltages. The present embodiment can also provide a control method for a semiconductor memory device having larger memory cell currents and higher threshold voltages.

Sixth Embodiment

Here, features overlapping with that in the first to fifth embodiments will not be described. The present embodiment will be described with reference to FIG. 4F. Vread is applied to $W_{LR(n-2)}$ (the conductive layer 34$i$), and Vcount is applied to $W_{LR(n-1)}$ (the conductive layer 34$j$). Meanwhile, VreadKK is applied to $W_{LR(n+2)}$ (the conductive layer 34$m$). As a result, the parasitic transistor between the $W_{LL(n)}$ (the conductive layer 34$d$) and $W_{LR(n+2)}$ (the conductive layer 34$m$) is switched ON, and memory cell current can be increased and the threshold voltage of the memory cell MC can be increased.

The present embodiment can also provide a semiconductor memory device having larger memory cell currents and higher threshold voltages. The present embodiment can also provide a control method for a semiconductor memory device having larger memory cell currents and higher threshold voltages.

Seventh Embodiment

Here, features overlapping with that in the first to sixth embodiments will not be described. The present embodiment will be described with reference to FIG. 4G. Adding to the sixth embodiment depicted in FIG. 4F, VreadK is applied to $W_{LR(n+1)}$ (the conductive layer 34$l$). As a result, the parasitic transistor between the $W_{LL(n)}$ (the conductive layer 34$d$) and $W_{LR(n+1)}$ (the conductive layer 34$l$) is switched OFF, and a reduction in memory cell current can be suppressed and a drop in the threshold voltage can be suppressed.

The present embodiment can also provide a semiconductor memory device having larger memory cell currents and higher threshold voltages. The present embodiment can also provide a control method for a semiconductor memory device having larger memory cell currents and higher threshold voltages.

Eighth Embodiment

Here, features overlapping with that in the first to seventh embodiments will not be described. The present embodiment will be described with reference to FIG. 4H. Adding to the seventh embodiment depicted in FIG. 4G, VreadKK is applied to $W_{LR(n-2)}$ (the conductive layer 34$i$) and VreadK is applied to $W_{LR(n-1)}$ (the conductive layer 34$j$). As a result, the parasitic transistor between $W_{LL(n)}$ (the conductive layer 34$d$) and $W_{LR(n-2)}$ (the conductive layer 34$i$) is switched ON and the parasitic transistor between $W_{LL(n)}$ (the conductive layer 34$d$) and $W_{LR(n-2)}$ (the conductive layer 34$j$) is switched OFF, and memory cell current can be increased and the threshold voltage of the memory cell MC can be increased.

The present embodiment can also provide a semiconductor memory device having larger memory cell currents and higher threshold voltages. The present embodiment can also provide a control method for a semiconductor memory device having larger memory cell currents and higher threshold voltages.

Ninth Embodiment

Here, features overlapping with that in the first to eighth embodiments will not be described. FIGS. 5A to 5E list voltages applied to conductive layers in the semiconductor memory device of the embodiments when data is read from a memory cell. The present embodiment will be described with reference to FIG. 5A. Voltage is applied to $W_{LL(n-3)}$ (the conductive layer 34$a$), $W_{LL(n-2)}$ (the conductive layer 34$b$), $W_{LL(n-1)}$ (the conductive layer 34$c$), $W_{LL(n)}$ (the conductive layer 34$d$), $W_{LL(n+1)}$ (the conductive layer 34$e$), $W_{LL(n+2)}$ (the conductive layer 34$f$), and $W_{LL(n+3)}$ (the conductive layer 34$g$) similarly to in the third embodiment, and voltage is applied to $W_{LR(n-3)}$ (the conductive layer 34$h$), $W_{LR(n-2)}$ (the conductive layer 34$i$), $W_{LR(n-1)}$ (the conductive layer 34$j$), $W_{LR(n)}$ (the conductive layer 34$k$), $W_{LR(n+1)}$ (the conductive layer 34$l$), $W_{LR(n+2)}$ (the conductive layer 34$m$), and $W_{LR(n+3)}$ (the conductive layer 34$n$) similarly to in the fourth embodiment.

The present embodiment can also provide a semiconductor memory device having larger memory cell currents and higher threshold voltages. The present embodiment can also provide a control method for a semiconductor memory device having larger memory cell currents and higher threshold voltages.

Tenth Embodiment

Here, features overlapping with that in the first to ninth embodiments will not be described. The present embodiment will be described with reference to FIG. 5B. The present embodiment differs from the ninth embodiment in that voltage is applied to $W_{LR(n-3)}$ (the conductive layer 34$h$), $W_{LR(n-2)}$ (the conductive layer 34$i$), $W_{LR(n-1)}$ (the conductive layer 34$j$), $W_{LR(n)}$ (the conductive layer 34$k$), $W_{LR(n+1)}$ (the conductive layer 34$l$), $W_{LR(n+2)}$ (the conductive layer 34$m$), and $W_{LR(n+3)}$ (the conductive layer 34$n$) similarly to in the fifth embodiment.

The present embodiment can also provide a semiconductor memory device having larger memory cell currents and higher threshold voltages. The present embodiment can also provide a control method for a semiconductor memory device having larger memory cell currents and higher threshold voltages.

Eleventh Embodiment

Here, features overlapping with that in the first to tenth embodiments will not be described. The present embodiment will be described with reference to FIG. 5C. The present embodiment differs from the ninth embodiment in that voltage is applied to $W_{LR(n-3)}$ (the conductive layer 34h), $W_{LR(n-2)}$ (the conductive layer 34i), $W_{LR(n-1)}$ (the conductive layer 34j), $W_{LR(n)}$ (the conductive layer 34k), $W_{LR(n+1)}$ (the conductive layer 34l), $W_{LR(n+2)}$ (the conductive layer 34m), and $W_{LR(n+3)}$ (the conductive layer 34n) similarly to in the sixth embodiment.

The present embodiment can also provide a semiconductor memory device having larger memory cell currents and higher threshold voltages. The present embodiment can also provide a control method for a semiconductor memory device having larger memory cell currents and higher threshold voltages.

Twelfth Embodiment

Here, features overlapping with that in the first to eleventh embodiments will not be described. The present embodiment will be described with reference to FIG. 5D. The present embodiment differs from the ninth embodiment in that voltage is applied to $W_{LR(n-3)}$ (the conductive layer 34h), $W_{LR(n-2)}$ (the conductive layer 34i), $W_{LR(n-1)}$ (the conductive layer 34j), $W_{LR(n)}$ (the conductive layer 34k), $W_{LR(n+1)}$ (the conductive layer 34l), $W_{LR(n+2)}$ (the conductive layer 34m), and $W_{LR(n+3)}$ (the conductive layer 34n) similarly to in the seventh embodiment.

The present embodiment can also provide a semiconductor memory device having larger memory cell currents and higher threshold voltages. The present embodiment can also provide a control method for a semiconductor memory device having larger memory cell currents and higher threshold voltages.

Thirteenth Embodiment

Here, features overlapping with that in the first to twelfth embodiments will not be described. The present embodiment will be described with reference to FIG. 5E. The present embodiment differs from the ninth embodiment in that voltage is applied to $W_{LR(n-3)}$ (the conductive layer 34h), $W_{LR(n-2)}$ (the conductive layer 34i), $W_{LR(n-1)}$ (the conductive layer 34j), $W_{LR(n)}$ (the conductive layer 34k), $W_{LR(n+1)}$ (the conductive layer 34l), $W_{LR(n+2)}$ (the conductive layer 34m), and $W_{LR(n+3)}$ (the conductive layer 34n) similarly to in the eighth embodiment.

The present embodiment can also provide a semiconductor memory device having larger memory cell currents and higher threshold voltages. The present embodiment can also provide a control method for a semiconductor memory device having larger memory cell currents and higher threshold voltages.

While certain embodiments have been described, these embodiments have been presented by way of example only, and are not intended to limit the scope of the inventions. Indeed, the semiconductor memory device and the control method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a substrate;
a first conductive layer provided above the substrate, the first conductive layer being spaced apart from the substrate in a first direction, and the first conductive layer being provided parallel to a substrate plane;
a second conductive layer provided adjacent to the first conductive layer in a second direction intersecting the first direction, the second conductive layer being provided parallel to the substrate plane;
a third conductive layer provided above the first conductive layer, the third conductive layer being spaced apart from the first conductive layer in the first direction, and the third conductive layer being provided parallel to the substrate plane;
a fourth conductive layer provided above the second conductive layer, the fourth conductive layer being spaced apart from the second conductive layer in the first direction, and the fourth conductive layer being provided parallel to the substrate plane;
a fifth conductive layer provided above the third conductive layer, the fifth conductive layer being spaced apart from the third conductive layer in the first direction, and the fifth conductive layer being provided parallel to the substrate plane;
a sixth conductive layer provided above the fourth conductive layer, the sixth conductive layer being spaced apart from the fourth conductive layer in the first direction, and the sixth conductive layer being provided parallel to the substrate plane;
an insulator provided between the first and second conductive layers, between the third and fourth conductive layers, and between the fifth and sixth conductive layers;
a first signal line provided between the first, third, and fifth conductive layers and the insulator, the first signal line extending in the first direction;
a second signal line provided between the second, fourth, and sixth conductive layers and the insulator, the second signal line extending in the first direction;
a first memory cell provided between the first conductive layer and the first signal line, the first memory cell being configured to store first information;
a second memory cell provided between the second conductive layer and the second signal line, the second memory cell being configured to store second information;
a third memory cell provided between the third conductive layer and the first signal line, the third memory cell being configured to store third information;
a fourth memory cell provided between the fourth conductive layer and the second signal line, the fourth memory cell being configured to store fourth information;
a fifth memory cell provided between the fifth conductive layer and the first signal line, the fifth memory cell being configured to store fifth information;
a sixth memory cell provided between the sixth conductive layer and the second signal line, the sixth memory cell being configured to store sixth information; and
a control circuit configured to apply a second voltage to the third conductive layer, the control circuit being configured to apply a third voltage to the fifth conductive layer, the control circuit being configured to read data from the first memory cell, the second voltage being smaller than a first voltage, the first voltage being applied to the first conductive layer, and the third voltage being larger than the first voltage.

2. The semiconductor memory device according to claim 1, further comprising:
a seventh conductive layer provided parallel to the substrate plane and provided between the substrate and the first conductive layer; and
an eighth conductive layer provided parallel to the substrate plane and provided between the substrate and the seventh conductive layer, wherein
the first signal line is further provided between the seventh and eighth conductive layers and the insulator, and
the control circuit is configured to apply a fourth voltage to the seventh conductive layer, the control circuit is configured to apply a fifth voltage to the eighth conductive layer, the control circuit is configured to read the data from the first memory cell, the fourth voltage is smaller than the first voltage, and the fifth voltage is larger than the first voltage.

3. The semiconductor memory device according to claim 2, further comprising:
a seventh memory cell provided between the seventh conductive layer and the first signal line, the seventh memory cell being configured to store seventh information; and
an eighth memory cell provided between the eighth conductive layer and the first signal line, the eighth memory cell being configured to store eighth information.

4. The semiconductor memory device according to claim 2, further comprising:
a ninth conductive layer provided adjacent to the seventh conductive layer across the insulator in the second direction, the ninth conductive layer being provided between the substrate and the second conductive layer; and
a tenth conductive layer provided adjacent to the eighth conductive layer across the insulator in the second direction, the tenth conductive layer being provided between the substrate and the ninth conductive layer.

5. The semiconductor memory device according to claim 4, further comprising:
a ninth memory cell provided between the ninth conductive layer and the second signal line, the ninth memory cell being configured to store ninth information; and
a tenth memory cell provided between the tenth conductive layer and the second signal line, the tenth memory cell being configured to store tenth information.

6. The semiconductor memory device according to claim 1, wherein the control circuit is configured to apply a sixth voltage to the fourth conductive layer, the control circuit is configured to apply a seventh voltage to the sixth conductive layer, the control circuit is configured to read the data from the first memory cell, the sixth voltage is smaller than the first voltage, and the seventh voltage is larger than the first voltage.

7. The semiconductor memory device according to claim 4, wherein the control circuit is configured to apply an eighth voltage to the ninth conductive layer, the control circuit is configured to apply a ninth voltage to the tenth conductive layer, the control circuit is configured to read the data from the first memory cell, the eighth voltage is smaller than the first voltage, and the ninth voltage is larger than the first voltage.

8. A semiconductor memory device comprising:
a substrate;
a plate-like first conductive layer provided above the substrate, the first conductive layer being provided at a first level provided spaced apart from the substrate, and the first conductive layer being provided parallel to a substrate plane;
a plate-like second conductive layer provided at the first level, the second conductive layer being provided spaced apart from the first conductive layer, and the second conductive layer being provided parallel to the substrate plane;
a plate-like third conductive layer provided at a second level provided above the first level, the second level being spaced apart from the first level, the third conductive layer being provided above the first conductive layer, and the third conductive layer being provided parallel to the substrate plane;
a plate-like fourth conductive layer provided at the second level, the fourth conductive layer being provided above the second conductive layer, and the fourth conductive layer being provided parallel to the substrate plane;
a plate-like fifth conductive layer provided at a third level provided above the second level, the third level being spaced apart from the second level, the fifth conductive layer being provided above the second conductive layer, and the fifth conductive layer being provided parallel to the substrate plane;
a plate-like sixth conductive layer provided at the third level, the sixth conductive layer being provided above the fourth conductive layer, and the sixth conductive layer being provided parallel to the substrate plane;
an insulator provided between the first, second, and third conductive layers and the fourth, fifth, and sixth conductive layers;
a first channel body provided between the first, second, and third conductive layers and the insulator, the first channel body extending toward the substrate plane;
a second channel body provided between the fourth, fifth, and sixth conductive layers and the insulator, the second channel body extending toward the substrate plane;
a memory cell provided between the first conductive layer and the first channel body, the memory cell having a charge storing film; and
a control circuit configured to apply a second voltage to the third conductive layer, the control circuit being configured to apply a third voltage to the fifth conductive layer, the second voltage being smaller than a first voltage, the first voltage being applied to the first conductive layer, and the third voltage being larger than the first voltage.

9. The semiconductor memory device according to claim 8, wherein the control circuit is configured to apply a fourth voltage to the fourth conductive layer, the control circuit is configured to apply a fifth voltage to the sixth conductive layer, the fourth voltage is smaller than the first voltage, and the fifth voltage is larger than the first voltage.

10. The semiconductor memory device according to claim 8, further comprising:
a plate-like seventh conductive layer provided at a fourth level provided between the substrate and the first level, the fourth level being spaced apart from the substrate and the first level, the seventh conductive layer being provided between the first conductive layer and the substrate, and the seventh conductive layer being provided parallel to the substrate plane;
a plate-like eighth conductive layer provided at the fourth level, the eighth conductive layer being provided between the second conductive layer and the substrate, and the eighth conductive layer being provided parallel to the substrate plane;

a plate-like ninth conductive layer provided at a fifth level provided between the substrate and the fourth level, the fifth level being spaced apart from the substrate and the fourth level, the ninth conductive layer being provided between the seventh conductive layer and the substrate, and the ninth conductive layer being provided parallel to the substrate plane;

a plate-like tenth conductive layer provided at the fifth level, the tenth conductive layer being provided between the eighth conductive layer and the substrate, and the tenth conductive layer being provided parallel to the substrate plane, wherein the insulator is provided between the seventh and ninth conductive layers and the eighth and tenth conductive layers, the first channel body is provided between the seventh and ninth conductive layers and the insulator, the second channel body is provided between the eighth and tenth conductive layers and the insulator, and the control circuit is configured to apply a sixth voltage to the seventh conductive layer, the control circuit is configured to apply a seventh voltage to the tenth conductive layer, the sixth voltage is smaller than the first voltage, and the seventh voltage is larger than the first voltage.

11. The semiconductor memory device according to claim 10, wherein the control circuit is configured to apply an eighth voltage to the eighth conductive layer, the control circuit is configured to apply a tenth voltage to the tenth conductive layer, the control circuit is configured to read data from the memory cell, the eighth voltage is smaller than the first voltage, and the tenth voltage is larger than the first voltage.

12. A control method for a semiconductor memory device, the device including
a substrate,
a plate-like first conductive layer provided above the substrate, the first conductive layer being spaced apart from the substrate, and the first conductive layer being provided parallel to a substrate plane,
a plate-like second conductive layer provided above the first conductive layer, the second conductive layer being spaced apart from the first conductive layer, and the second conductive layer being provided parallel to the substrate plane,
a plate-like third conductive layer provided above the second conductive layer, the third conductive layer being spaced apart from the second conductive layer, and the third conductive layer being provided parallel to the substrate plane,
an insulator provided passing through the first, second, and third conductive layers,
a channel body provided between the first, second, and third conductive layers and the insulator, the channel body extending toward the substrate plane, and
a memory cell provided between the first conductive layer and the channel body, the memory cell having a charge storing film,
the method comprising:
applying a second voltage to the second conductive layer, applying a third voltage to the third conductive layer, and reading data from the memory cell, the second voltage being smaller than a first voltage, and the third voltage being larger than the first voltage.

* * * * *